(12) United States Patent
McIntyre

(10) Patent No.: US 6,549,073 B1
(45) Date of Patent: Apr. 15, 2003

(54) OPERATIONAL AMPLIFIER WITH COMMON MODE GAIN CONTROL USING IMPEDANCE TRANSPORT

(75) Inventor: Harry J. McIntyre, Los Angeles, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 10/024,237

(22) Filed: Dec. 21, 2001

(51) Int. Cl.[7] .............................. H03F 3/45; H03F 3/16
(52) U.S. Cl. ...................... 330/253; 330/254; 330/258; 330/300
(58) Field of Search ................................. 330/253, 254, 330/258, 300

(56) References Cited

U.S. PATENT DOCUMENTS

| | | | |
|---|---|---|---|
| 3,947,778 A | * 3/1976 | Hsiao et al. | 330/253 |
| 4,271,394 A | 6/1981 | Leidich | 330/258 |
| 4,638,259 A | 1/1987 | Saari | 330/253 |
| 4,881,044 A | 11/1989 | Kinoshita et al. | 330/253 |
| 5,115,206 A | * 5/1992 | Mack et al. | 330/260 |
| 5,694,033 A | 12/1997 | Wei et al. | 323/315 |
| 5,734,296 A | 3/1998 | Dotson et al. | 330/253 |
| 5,939,904 A | * 8/1999 | Fetterman et al. | 327/65 |
| 5,990,743 A | * 11/1999 | Gabara | 330/253 |
| 6,181,195 B1 | 1/2001 | McIntyre | 327/538 |
| 6,281,753 B1 | 8/2001 | Corsi et al. | 330/261 |

* cited by examiner

Primary Examiner—Patricia T. Nguyen
(74) Attorney, Agent, or Firm—Philip T. Virga

(57) ABSTRACT

A differential amplifier circuit connected to an impedance transport circuit is disclosed. The impedance transport circuit transports an AC input impedance to an output impedance and invert its polarity thereby enabling the common-mode gain of the differential amplifier to be varied. This impedance transport circuit utilizes two MOS transistors and an Op-Amp that causes the drain voltages of the transistors to be equal.

15 Claims, 2 Drawing Sheets

OPERATIONAL AMPLIFIER WITH COMMON MODE GAIN CONTROL USING IMPEDANCE TRANSPORT

The present invention relates to an amplifying circuit, and to means, which enables a differential amplifier to exhibit a zero common mode gain or a variable common mode gain.

Single stage differential amplifier circuits are used in many electronic applications, such as programmable logic arrays. For programmable logic arrays differential amplifier circuits are designed to vary the common-mode gain and common-mode rejection ratio utilizing more than one amplifier stage and/or with additional complex electronic circuitry. It would be desirable therefore to provide a circuit that improves the features of differential amplifiers with the use of a minimum amount of components.

SUMMARY OF THE INVENTION

In accordance with the present invention, there is disclosed a differential amplifier circuit connected to an impedance transport circuit which is capable of transporting an AC input impedance to an output impedance and invert its polarity thereby enabling the common-mode gain of the differential amplifier to be varied. This impedance transport circuit utilizes two MOS transistors and an Op-Amp that causes the drain voltages of the transistors to be equal

DETAILED DESCRIPTION OF THE DRAWINGS

Figure 1:
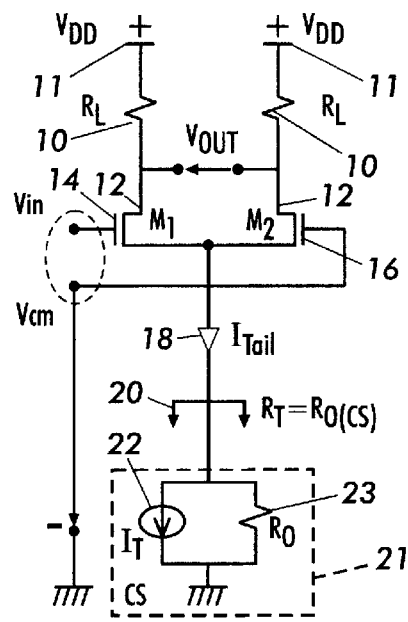
FIG. 1 shows a diagram of a widely known single stage differential amplifier.

FIG. 1 shows a diagram of a single stage differential amplifying circuit for use in the present invention. The single stage differential amplifying circuit can be used as an amplifier of any stage in a multi-stage amplifier.

In FIG. 1, the differential amplifier consists of MOSFET's (metal oxide field effect transistors) M1 14 and M2 16 whose sources are differentially connected to each other, and a load means 12 consisting of a pair of resistances $R_L$ 12 connected to a positive drain voltage 10. To the sources of the differential pair of FET's M1, M2, 14 and 16 respectively is connected a constant-current source 22 that supplies a direct current and that serves as a source common impedance 22. The constant-current source may be a FET M3 22 as shown in FIG. 1. The common impedance 22 is shown as resistance Ro(M3) 20. Therefore, in the present configuration a tail current 18 is generated by use of the FET M3 22. The common-mode gain can be increased or decreased by adjustment of the tail current 18 by varying the resistance Ro(M3) 20.

Figure 2:
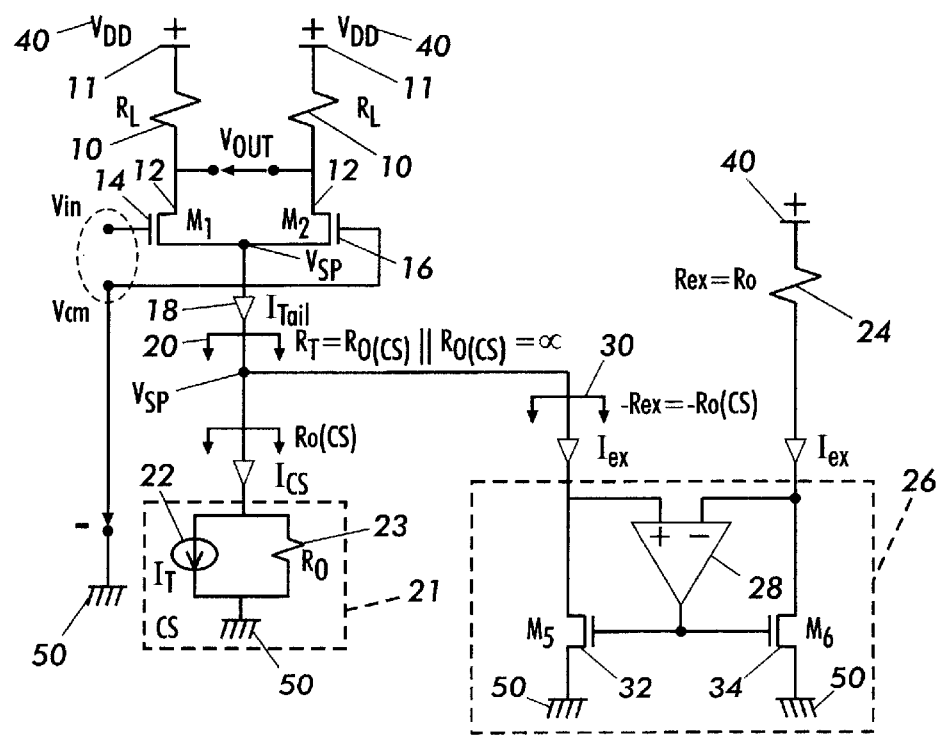
FIG. 2 shows the differential amplifier of FIG. 1 connected to the impedance transport circuit in accordance with the present invention.

Referring now to FIG. 2, there is shown the differential amplifier of FIG. 1 connected to the impedance transport circuit in accordance with the present invention. All the elements of the differential amplifier circuit of FIG. 1 are designated by the same reference numerals. The impedance transport circuit 26 comprises an Op-Amp 28 and two p-channel MOS transistors M5 32 and M6 34. The drain of transistor M5 32 is connected to the sources of the differential pair of FET's M1, M2, 14 and 16, respectively. The sources of both transistors M5 32 and M6 34 are grounded. The output of the Op-Amp 28 is connected to the gates of both transistors M5 32 and M6 34. The positive input of the Op-Amp 28 is connected to the drain of transistor M5 32 and the negative input of the Op-amp 28 is connected to the drain of the transistor M6 34. An adjustable resistor Rex 24 is connected to the negative input of the Op-Amp 28 and the drain of transistor M6 34.

Figure 3:
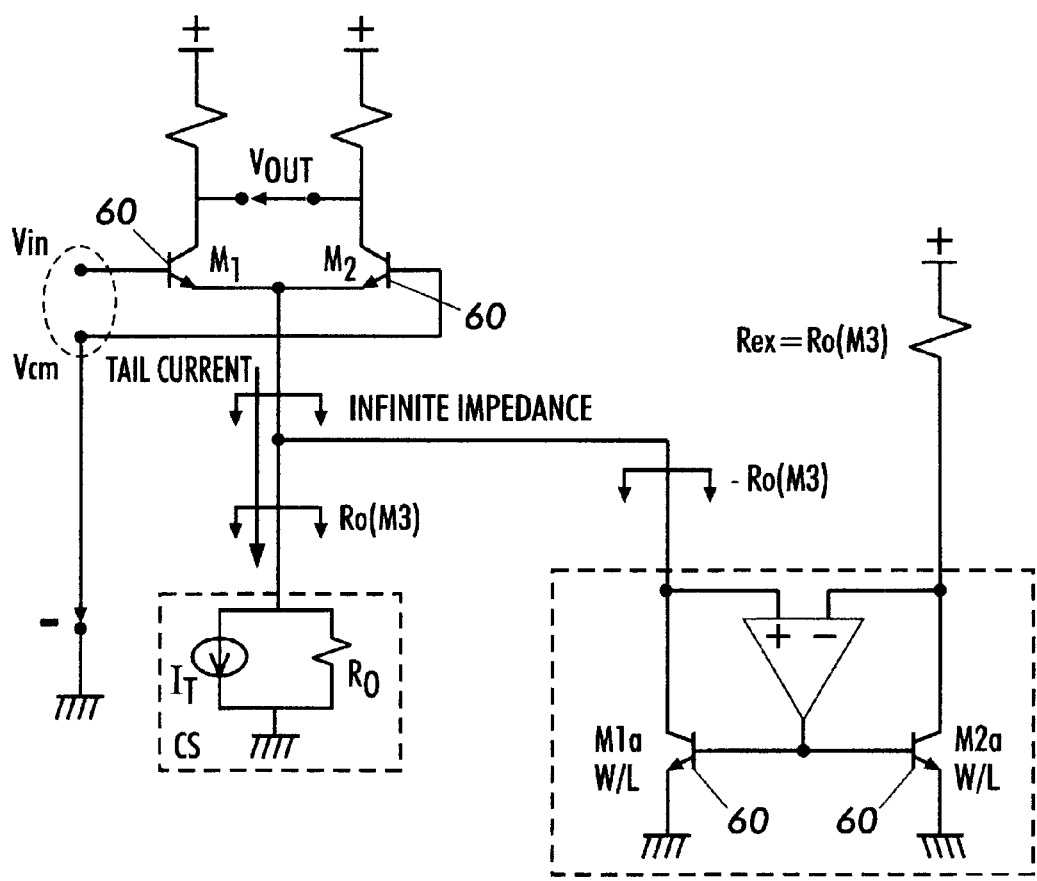

The theory and operation of the impedance transport circuit used in the present invention is disclosed in U.S. Pat. No. 6,181,195, assigned to the assignee of the present invention. U.S. Pat. No. 6,181,195 is incorporated herein in its entirety. In operation, if the resistor Rex 24 is set equal to Ro(M3) 20, the inversion of the impedance Rex 24 is transported to be parallel to the FET M3 22 and cancels out its impedance Ro(M3) 20, such that the combined impedance is infinite. The infinite impedance yields a common-mode gain equal to zero. Additionally, Rex 24 is adjustable wherein a range of common-mode gain can be obtained including inverted values. Lastly, the described technique is applicable to both MOS and bipolar circuitry and to the complement of the circuitry illustrated as shown in FIG. 3 with bipolar transistors 60.

It should be noted that numerous changes in details of construction and the combination and arrangement of elements may be resorted to without departing from the true spirit and scope of the invention as hereinafter claimed.

What is claimed is:

1. A differential amplifier circuit, comprising
a first metal oxide silicon field effect transistor and a second metal oxide silicon field effect transistor whose sources are differentially connected to each other;
a constant current source connected to the sources of said first and said second transistor producing a first common impedance;
a third metal oxide silicon field effect transistor having a first drain voltage;
a fourth metal oxide silicon field effect transistor having a second drain voltage;
a second adjustable impedance,
a first balancing circuit being electrically connected to said third transistor, said fourth transistor and said second adjustable impedance; said third and said fourth transistors being responsive to said first balancing circuit for causing said second adjustable impedance to have a polarity opposite said first common impedance wherein varying said second adjustable impedance changes said differential amplifier's circuit's common-mode gain.

2. The differential amplifier circuit recited in claim 1, wherein said first balancing circuit is an Op-amp.

3. The differential amplifier circuit recited in claim 1 wherein when said second adjustable impedance is set equal to said first common impedance said common-mode gain is equal to zero.

4. The differential amplifier circuit recited in claim 1, wherein said first and said second metal oxide silicon field effect transistors are p-channel transistors.

5. The differential amplifier circuit recited in claim 1, wherein said first and said second metal oxide silicon field effect transistors are p-channel transistors and said third and fourth metal oxide silicon field effect transistors are n-channel transistors.

6. The differential amplifier circuit recited in claim 1, wherein said first and said second metal oxide silicon field effect transistors are n-channel transistors.

7. The differential amplifier circuit recited in claim 1, wherein said first and said second metal oxide silicon field effect transistors are n-channel transistors and said third and fourth metal oxide silicon field effect transistors are p-channel transistors.

8. A differential amplifier circuit, comprising
   a first NMOS metal oxide silicon field effect transistor and a second NMOS metal oxide silicon field effect transistor whose sources are differentially connected to each other;
   a constant current source connected to the sources of said first and said second transistor producing a first common impedance;
   a third NMOS metal oxide silicon field effect transistor having a first drain voltage;
   a PMOS fourth metal oxide silicon field effect transistor having a second drain voltage;
   a second adjustable impedance,
   a first balancing circuit being electrically connected to said third transistor, said fourth transistor and said second adjustable impedance; said third and said fourth transistors being responsive to said first balancing circuit for causing said second adjustable impedance to have a polarity opposite said first common impedance wherein varying said second adjustable impedance changes said differential amplifier's circuit's common-mode gain.

9. The differential amplifier circuit recited in claim 8, wherein said first balancing circuit is an Op-amp.

10. The differential amplifier circuit recited in claim 8 wherein when said second adjustable impedance is set equal to said first common impedance said common-mode gain is equal to zero.

11. The differential amplifier circuit recited in claim 8, wherein said first and said NMOS second metal oxide silicon field effect transistors are bipolar transistors.

12. The differential amplifier circuit recited in claim 8, wherein said first and said second NMOS metal oxide silicon field effect transistors are bi-polar transistors and said third and fourth PMOS metal oxide silicon field effect transistors are bi-polar transistors.

13. A differential amplifier circuit, comprising
   a first bi-polar transistor and a second bipolar transistor whose emitters are differentially connected to each other;
   a constant current source connected to the emitters of said first and said second bipolar transistor producing a first common impedance;
   a third NMOS metal oxide silicon field effect transistor having a first drain voltage;
   a PMOS fourth metal oxide silicon field effect transistor having a second drain voltage;
   an second adjustable impedance,
   a first balancing circuit being electrically connected to said third transistor, said fourth transistor and said second adjustable impedance; said third and said fourth transistors being responsive to said first balancing circuit for causing said second adjustable impedance to have a polarity opposite said first common impedance wherein varying said second adjustable impedance changes said differential amplifier's circuit's common-mode gain.

14. The differential amplifier circuit recited in claim 13, wherein said first balancing circuit is an Op-amp.

15. The differential amplifier circuit recited in claim 13 wherein when said second adjustable impedance is set equal to said first common impedance said common-mode gain is equal to zero.

* * * * *